(12) United States Patent
Truong et al.

(10) Patent No.: US 9,436,194 B1
(45) Date of Patent: Sep. 6, 2016

(54) POWER SENSING

(71) Applicant: Silego Technology, Inc., Santa Clara, CA (US)

(72) Inventors: Tom Truong, San Francisco, CA (US); Albert Chen, Saratoga, CA (US)

(73) Assignee: Silego Technology, Inc., Santa Clara, CA (US)

( * ) Notice: Subject to any disclaimer, the term of this patent is extended or adjusted under 35 U.S.C. 154(b) by 0 days.

(21) Appl. No.: 14/641,235

(22) Filed: Mar. 6, 2015

Related U.S. Application Data

(60) Provisional application No. 61/949,156, filed on Mar. 6, 2014.

(51) Int. Cl.
*H03M 1/12* (2006.01)
*G05F 1/46* (2006.01)
*H02J 7/00* (2006.01)
*G01R 21/133* (2006.01)

(52) U.S. Cl.
CPC ............ *G05F 1/462* (2013.01); *G01R 21/133* (2013.01); *H02J 7/0029* (2013.01)

(58) Field of Classification Search
CPC .. G01R 19/0092; G01R 21/1331; G05F 3/26
USPC ........................................ 341/141, 136, 155
See application file for complete search history.

(56) References Cited

U.S. PATENT DOCUMENTS

| | | | |
|---|---|---|---|
| 6,943,518 B1 * | 9/2005 | Mooney | H02M 3/158 318/490 |
| 7,023,672 B2 * | 4/2006 | Goodfellow | H02M 3/1584 361/111 |
| 7,046,180 B2 * | 5/2006 | Jongsma | H03M 1/1076 341/141 |
| 7,365,559 B2 * | 4/2008 | Colbeck | G01R 19/0092 324/762.09 |
| 7,772,816 B2 * | 8/2010 | Cho | G05F 1/56 323/274 |
| 8,648,586 B2 * | 2/2014 | Singh | G05F 1/573 323/315 |
| 2009/0256733 A1 * | 10/2009 | Kim | H03M 1/002 341/136 |
| 2012/0268075 A1 * | 10/2012 | Wolf | G01R 31/3613 320/132 |
| 2014/0035651 A1 * | 2/2014 | Ostrom | G01R 19/0092 327/323 |

* cited by examiner

*Primary Examiner* — Jean B Jeanglaude
(74) *Attorney, Agent, or Firm* — Van Pelt, Yi & James LLP

(57) ABSTRACT

Improved techniques for sensing and reporting consumed power are disclosed. The disclosed techniques comprise an integrated circuit solution for sensing power. In some embodiments, such an integrated circuit comprises a resistor on which a sense voltage sensed across an external resistor in response to a load current is mirrored and an analog-to-digital converter configured to regulate the voltage across the resistor and output a binary value representing power. The binary value representing power may integrate one or more electrical or environmental parameters such as current, voltage, temperature, battery voltage, etc.

23 Claims, 3 Drawing Sheets

POWER SENSING

CROSS REFERENCE TO OTHER APPLICATIONS

This application claims priority to U.S. Provisional Patent Application No. 61/949,156 entitled SENSING POWER SYSTEM ENVIRONMENTS AND REPORTING OPERATION REGION filed Mar. 6, 2014 which is incorporated herein by reference for all purposes.

BACKGROUND OF THE INVENTION

Power sensing comprises sensing voltage and current and multiplying to determine consumed power (P=I*V). A commonly employed technique for power sensing includes using a high precision discrete resistor connected in series with a power source. The current through the resistor causes a voltage drop across the resistor. Since the resistor value is known, the current may be represented by the voltage drop across the resistor. Power may be determined using an operational amplifier that multiplies current through the sense resistor and the source voltage. For source voltage sensing, an analog-to-digital converter (ADC) may be employed to convert the source voltage value to a digital format. If an ADC is used for both current and source voltage sensing, such digital values may be post processed by a microprocessor to determine power consumed.

Conventional power sensing techniques, however, suffer from numerous drawbacks. Complex circuitry with multiple stages including post processing by a microprocessor is typically needed for multiplying current and voltage. However, various sources of errors are still introduced by typical power sensing techniques. Conventional power sensing circuitry is typically characterized by high power consumption while providing poor speed performance and overall accuracy. More specifically, conventional techniques for sensing current across active or passive components create conflicting requirements between accuracy and low power dissipation across the components while conventional techniques for sensing source voltage are bound by the absolute voltage rating of the device process technology.

Improved power sensing techniques that do not have the shortcomings of existing techniques would be useful.

BRIEF DESCRIPTION OF THE DRAWINGS

Various embodiments of the invention are disclosed in the following detailed description and the accompanying drawings.

DETAILED DESCRIPTION

Figure 1:
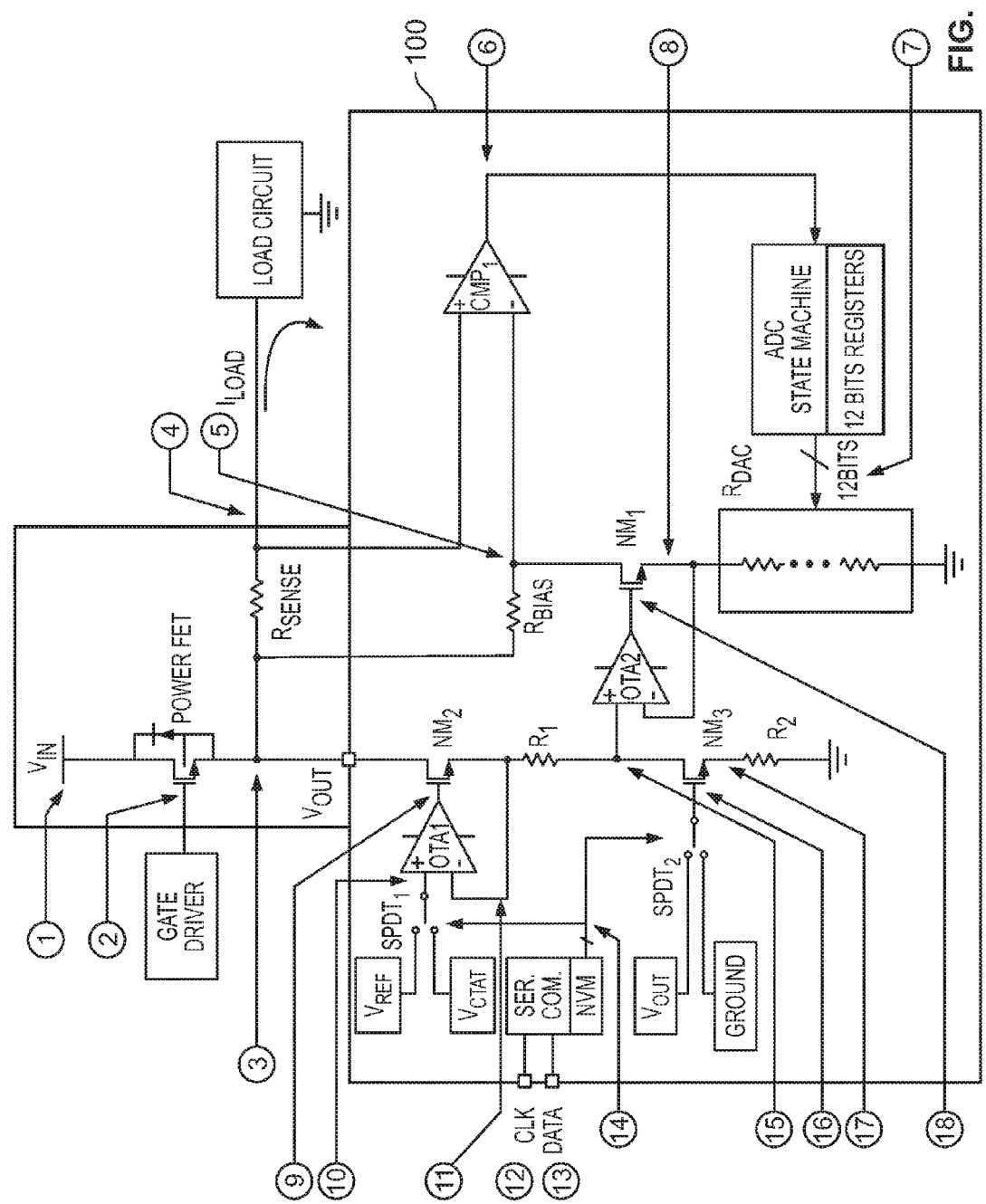
FIG. 1 is a high level circuit diagram illustrating an embodiment of an integrated circuit configured to sense power consumed by a system.

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims, and the invention encompasses numerous alternatives, modifications, and equivalents. Numerous specific details are set forth in the following description in order to provide a thorough understanding of the invention. These details are provided for the purpose of example, and the invention may be practiced according to the claims without some or all of these specific details. For the purpose of clarity, technical material that is known in the technical fields related to the invention has not been described in detail so that the invention is not unnecessarily obscured.

Power sensing is needed for a system to manage power consumption so that it can operate with power efficiency and avoid power overloading and overheating. Direct power sensing techniques having low overhead cost (e.g., in terms of needed circuitry and power consumption) while providing high accuracy are disclosed herein. In some embodiments, the disclosed power sensing circuitry comprises an integrated circuit.

In some embodiments of the disclosed techniques for power sensing, the load current ($I_{LOAD}$) is applied on a sense element to produce a sense voltage ($V_{SENSE}$). Voltage $V_{SENSE}$ is mirrored on to a sense element internal to an associated integrated circuit. This voltage having a value equal to $V_{SENSE}$ that is projected on to the internal element is regulated by an analog-to-digital converter (ADC). The ADC outputs a binary value that represents power. Various electrical and/or environmental parameters may influence safe operation of a system. In some embodiments, one or more such parameters are also factored in to generate a total power margin for the system that is represented by the binary value. Various aspects and embodiments of this technique for sensing power are further described in detail below.

FIG. 1 is a high level circuit diagram illustrating an embodiment of an integrated circuit 100 configured to sense power consumed by a system. FIG. 1 provides one example of a power sensing circuit 100. In other embodiments, power sensing circuit 100 may comprise any other appropriate configuration and/or circuitry in addition to and/or instead of that described with respect to FIG. 1. In the given example, the portion of the system comprising a power switch and load are depicted, with circuit 100 configured to determine and report the power consumed by the system. Specifically, circuit 100 facilitates sensing current and voltage as well as optionally integrating one or more electrical and/or environmental parameters to determine and report power in a binary format. A description of various nodes associated with understanding the operation of circuit 100 follows.

Node 1 corresponds to a supply voltage at the drain of a high side power FET (power metal-oxide-semiconductor field effect transistor).

Node 2 corresponds to the gate of the power FET driven by a gate driver that switches (i.e., turns on or off) the power FET supplying power to the system.

Node 3 corresponds to the source output of the power FET. The current from the source of the power FET is applied across sense resistor $R_{SENSE}$ resulting in a voltage drop across resistor $R_{SENSE}$.

Node 4 corresponds to the output of resistor $R_{SENSE}$ to the load. This node is connected to the positive input of comparator $CMP_1$ for sensing the voltage drop of resistor $R_{SENSE}$.

Node 5 corresponds to the negative input of comparator $CMP_1$. Comparator $CMP_1$ compares node 4 and node 5, and the result is used by a digital state machine.

Node 6 corresponds to the output of comparator $CMP_1$. The output of comparator $CMP_1$ is processed by an ADC (analog-to-digital converter) and converted into a digital value.

Node 7 corresponds to the bits generated by the ADC state machine that set the value of resistor $R_{DAC}$. In the given example, the output of comparator $CMP_1$ is converted into a twelve bits digital (binary) signal.

Node 8 corresponds to the source node of NMOS (n-type metal-oxide-semiconductor field effect transistor) transistor $NM_1$ regulated by operational amplifier $OTA_2$. This voltage is proportional to node 3 voltage $V_{OUT}$ and is applied on resistor $R_{DAC}$. The result is a bias current that is proportional to voltage $V_{OUT}$ and resistance $R_{DAC}$. This current generates a voltage drop across resistor $R_{BIAS}$. In steady state, the loop from nodes 3-4-5-6-7-8-3 forces the voltages across resistor $R_{SENSE}$ and resistor $R_{BIAS}$ to be the same.

Node 9 corresponds to the output of operational amplifier $OTA_1$ driving NMOS transistor $NM_2$.

Node 10 corresponds to the positive input of operational amplifier $OTA_1$. Switch $SPDT_1$ may be configured to pass reference signal $V_{REF}$ or another signal, e.g., with temperature information. In some cases, signal $V_{REF}$ is used to set a boundary condition of a sensed signal. For example, $V_{REF}$ may be proportional to voltage $V_{OUT\_MAX}$, where $V_{OUT\_MAX}$ is the absolute maximum voltage on the output of the power FET (i.e., the maximum $V_{OUT}$). With switch $SPDT_1$ passing voltage $V_{REF}$, circuit 100 is used to sense both voltage and current on the load circuit. One or more other types of sensing may be integrated to sense other system conditions. For example, switch $SPDT_1$ may be configured to pass signal $V_{CTAT}$ instead of signal $V_{REF}$. Signal $V_{CTAT}$ is a voltage complement to absolute temperature. In this case, circuit 100 senses both temperature and current on the load circuit.

Node 11 corresponds to the negative input of operational amplifier $OTA_1$ and comprises a low impedance node forced to be equal to the output of switch $SPDT_1$.

Node 12 corresponds to a clock for serial communication for reading/writing internal registers and/or memory.

Node 13 corresponds to a data line for accessing internal registers and/or memory.

Node 14 corresponds to a control line for driving switch $SPDT_1$ and switch $SPDT_2$ to select parameters to incorporate into the sensing.

Node 15 corresponds to the positive input of operational amplifier $OTA_2$. This node is the summing node of different signals incorporated for sensing.

Node 16 corresponds to switch $SPDT_2$. If switch $SPDT_2$ selects reference signal $V_{OUT}$, power on the load circuit is sensed. If switch $SPDT_2$ selects reference ground instead, the current on the load circuit is sensed.

Node 17 corresponds to the source node of NMOS transistor $NM_3$. Transistor $NM_3$ regulates the current and voltage across resistor $R_2$. Current applied across resistor $R_1$ results in a voltage generated on node 15.

Node 18 corresponds to the output of operational amplifier $OTA_2$ which drives transistor $NM_1$ to regulate node 8 to be equal to node 15.

A detailed analysis of circuit 100 is next provided. More specifically, converting power loading into a (e.g., twelve bit) digital or binary format using a precision external resistor is mathematically shown. For the following analysis, let $SPDT_1$ be switched to $V_{REF}$ and let $SPDT_2$ be switched to $V_{OUT}$.

The node 15 voltage is represented by equation (1):

$$V_{15} = V_{REF} - (V_{OUT}/R_2 * R_1) \quad (1)$$

where $V_{OUT}$ is the power supply output voltage and $V_{REF}$ is a band-gap reference voltage. The node 8 voltage is forced to equal the node 15 voltage due to operational amplifier $OTA_2$ as represented by equation (2):

$$V_{15} = V_8 \quad (2)$$

The current across resistor $R_{BIAS}$ is represented by equation (3):

$$I_{BIAS} = V_8 / R_{DAC} \quad (3)$$

Substituting equivalent values from equation (2) and equation (1) in equation (3) results in equation (4):

$$I_{BIAS} = [V_{REF} - (V_{OUT}/R_2 * R_1)] / R_{DAC} \quad (4)$$

Under steady state conditions, the circuit maintains equal voltages across resistors $R_{SENSE}$ and $R_{BIAS}$ as represented by equation (5):

$$V_{BIAS} = V_{SENSE} \quad (5)$$

The power of the system is defined by equation (6):

$$P_{OUT} = I_{LOAD} * V_{OUT} \quad (6)$$

The maximum power the system is bound by is accordingly represented by equation (7):

$$P_{OUT\_MAX} = I_{OUT\_MAX} * V_{OUT\_MAX} \quad (7)$$

The maximum voltages across resistors $R_{SENSE}$ and $R_{BIAS}$ are represented by equation (8):

$$V_{BIAS\_MAX} = V_{SENSE\_MAX} \quad (8)$$

Based on the premises of equations (1)-(8), maximum power may further be defined by equation (9):

$$V_{8\_MIN} / R_{DAC\_LSB} * R_{BIAS} = I_{OUT\_MAX} * R_{SENSE} \quad (9)$$

where $V_{8\_MIN}$ is the minimum voltage at node 8 when $V_{OUT}$ is maximum, which according to equations (1) and (2) is further represented by equation (10):

$$V_{8\_MIN} = V_{REF} - (V_{OUT\_MAX} * R_1/R_2) \quad (10)$$

Multiplying both sides of equation (9) by $V_{OUT\_MAX}$ and substituting with equation (7) results in equation (11):

$$V_{OUT\_MAX} * V_{8\_MIN} / R_{DAC\_LSB} * R_{BIAS} = P_{OUT\_MAX} * R_{SENSE} \quad (11)$$

Let $V_{REF}$ and $V_{OUT\_MAX}$ be defined by a factor F as given by equation (12):

$$V_{REF} = F * V_{OUT\_MAX} \quad (12)$$

Given that $DAC_{VALUE}$ is the digital (binary) value of power, $DAC_{VALUE\_MAX}$ is the maximum digital (binary) value of power, and $P_{OUT\_LSB}$ is the minimum quantized step of power, power and maximum power are defined by equation (13) and equation (14), respectively:

$$P_{OUT}=P_{OUT\_LSB}*DAC_{VALUE} \quad (13)$$

$$P_{OUT\_MAX}=P_{OUT\_LSB}*DAC_{VALUE\_MAX} \quad (14)$$

Resistance $R_{DAC\_MAX}$ is defined by equation (15):

$$R_{DAC\_MAX}=DAC_{VALUE\_MAX}*R_{DAC\_LSB} \quad (15)$$

Power $P_{OUT}$ is represented by $DAC_{VALUE}$ by substituting, scaling, and solving using equations (10)-(15) to give equations (16)-(18):

$$DAC_{VALUE} = \frac{P_{OUT}}{V_{OUT\_MAX}*[V_{REF}-(V_{OUT\_MAX}*R_1/R_2)]*R_{BIAS}/R_{DAC\_MAX}/R_{SENSE}} \quad (16)$$

$$DAC_{VALUE} = \frac{P_{OUT}*R_{SENSE}}{V_{OUT\_MAX}*[F*V_{OUT\_MAX}-(V_{OUT\_MAX}*R_1/R_2)]*R_{BIAS}/R_{DAC\_MAX}} \quad (17)$$

$$DAC_{VALUE} = \frac{P_{OUT}*R_{SENSE}}{V^2_{OUT\_MAX}*(R_{BIAS}/R_{DAC\_MAX})*[F-(R_1/R_2)]} \quad (18)$$

$DAC_{VALUE}$ is a binary representation of $P_{OUT}$ since $R_{SENSE}$, $V^2_{OUT\_MAX}$, $R_{BIAS}$, $R_{DAC\_MAX}$, F, $R_1$, and $R_2$ are constants. Equation (18) implies that a trade-off exists between the range of $P_{OUT}$ that can be sensed and the resolution of $DAC_{VALUE}$. The boundary condition $V^2_{OUT\_MAX}$ needs to be set. The extent of error, if any, depends on the accuracy of external resistor $R_{SENSE}$. For internal components, the accuracy depends on the process of matching the resistor. Any error introduced is due to error(s) in the ratios of ($R_{BIAS}/R_{DAC\_MAX}$) and ($R_1/R_2$).

The above analysis described converting power loading into a digital or binary format. Next, converting current loading into a (e.g., twelve bit) digital or binary format using a precision external resistor is mathematically shown. In this case, switch $SPDT_2$ is switched to ground.

Let $V_{SENSE}$ be the voltage across resistor $R_{SENSE}$ with current $I_{LOAD}$ as given by equation (19):

$$V_{SENSE}=R_{SENSE}*I_{LOAD} \quad (19)$$

Given that $I_{LOAD\_LSB}$ is the minimum quantized step of $I_{LOAD}$, equation (19) can be used to give equation (20):

$$V_{SENSE\_LSB}=R_{SENSE}*I_{LOAD\_LSB} \quad (20)$$

Given that $DAC_{CUR}$ is the digital (binary) value of current, current is defined by equation (21):

$$I_{LOAD}=DAC_{CUR}*I_{LOAD\_LSB} \quad (21)$$

Let $V_{BIAS}$ be the voltage across resistor $R_{BIAS}$ with current $I_{BIAS}$ as given by equation (22):

$$V_{BIAS}=R_{BIAS}*I_{BIAS} \quad (22)$$

Defining $I_{BIAS}$ using reference voltage $V_{REF}$ results in equation (23) and equation (24):

$$I_{BIAS}=V_{REF}/R_{DAC} \quad (23)$$

$$I_{BIAS\_LSB}=V_{REF}/R_{DAC\_MAX} \quad (24)$$

Regulating $V_{BIAS\_LSB}$ so that it is equal to $V_{sENSE\_LSB}$ results in equation (25):

$$V_{BIAS\_LSB}=V_{SENSE\_LSB} \quad (25)$$

From equations (19)-(25), equations (26)-(28) result:

$$I_{BIAS\_LSB}=R_{SENSE}*I_{LOAD\_LSB}/R_{BIAS} \quad (26)$$

$$V_{REF}/R_{DAC\_MAX}=R_{SENSE}*I_{LOAD\_LSB}/R_{BIAS} \quad (27)$$

$$R_{DAC\_MAX}=(V_{REF}*R_{BIAS})/(R_{SENSE}*I_{LOAD\_LSB}) \quad (28)$$

Converting $I_{LOAD\_LSB}$ to $I_{LOAD}$ using scaling value $DAC_{CUR}$ gives equations (29) and (30):

$$R_{DAC\_MAX}/DAC_{CUR}=(V_{REF}*R_{BIAS})/(R_{SENSE}*I_{LOAD}) \quad (29)$$

$$DAC_{CUR}=(I_{LOAD}*R_{SENSE})*(R_{DAC\_MAX}/R_{BIAS})/V_{REF} \quad (30)$$

$DAC_{CUR}$ is a digital or binary representation of $I_{LOAD}$ since $R_{SENSE}$, $R_{DAC\_MAX}$, $R_{BIAS}$, and $V_{REF}$ are predetermined values. Equation (30) implies that a trade-off exists between the range of $I_{LOAD}$ that can be sensed and the resolution of $DAC_{CUR}$ by setting the ratio ($R_{DAC\_MAX}/R_{BIAS}$). Sources of error(s) can easily be determined and depend on the accuracy of $R_{SENSE}$, the ratio ($R_{DAC\_MAX}/R_{BIAS}$), and $V_{REF}$.

In some embodiments, circuit 100 may be employed to regulate safe power-temperature operation. The mathematics involved is setting a power-temperature safe operating region are next described.

In equation (16), replacing $V_{REF}$ with $V_{CTAT}$ (where $V_{CTAT}$ is a complementary to absolute temperature voltage) gives equation (31):

$$P_{OUT}=DAC_{VALUE}*\{V_{OUT\_MAX}*[V_{CTAT}-(V_{OUT\_MAX}*R_1/R_2)]*R_{BIAS}/R_{DAC\_MAX}/R_{SENSE}\} \quad (31)$$

Taking the derivative $\partial P_{OUT}/\partial V_{CTAT}$ yields equations (32) and (33):

$$DAC_{LIMIT}=\partial P_{OUT}/\partial V_{CTAT}*R_{SENSE}/\{V_{OUT\_MAX}*R_{BIAS}/R_{DAC\_MAX}\} \quad (32)$$

$$DAC_{VALUE} \leq DAC_{LIMIT\_TEMP} \quad (33)$$

Figure 2:
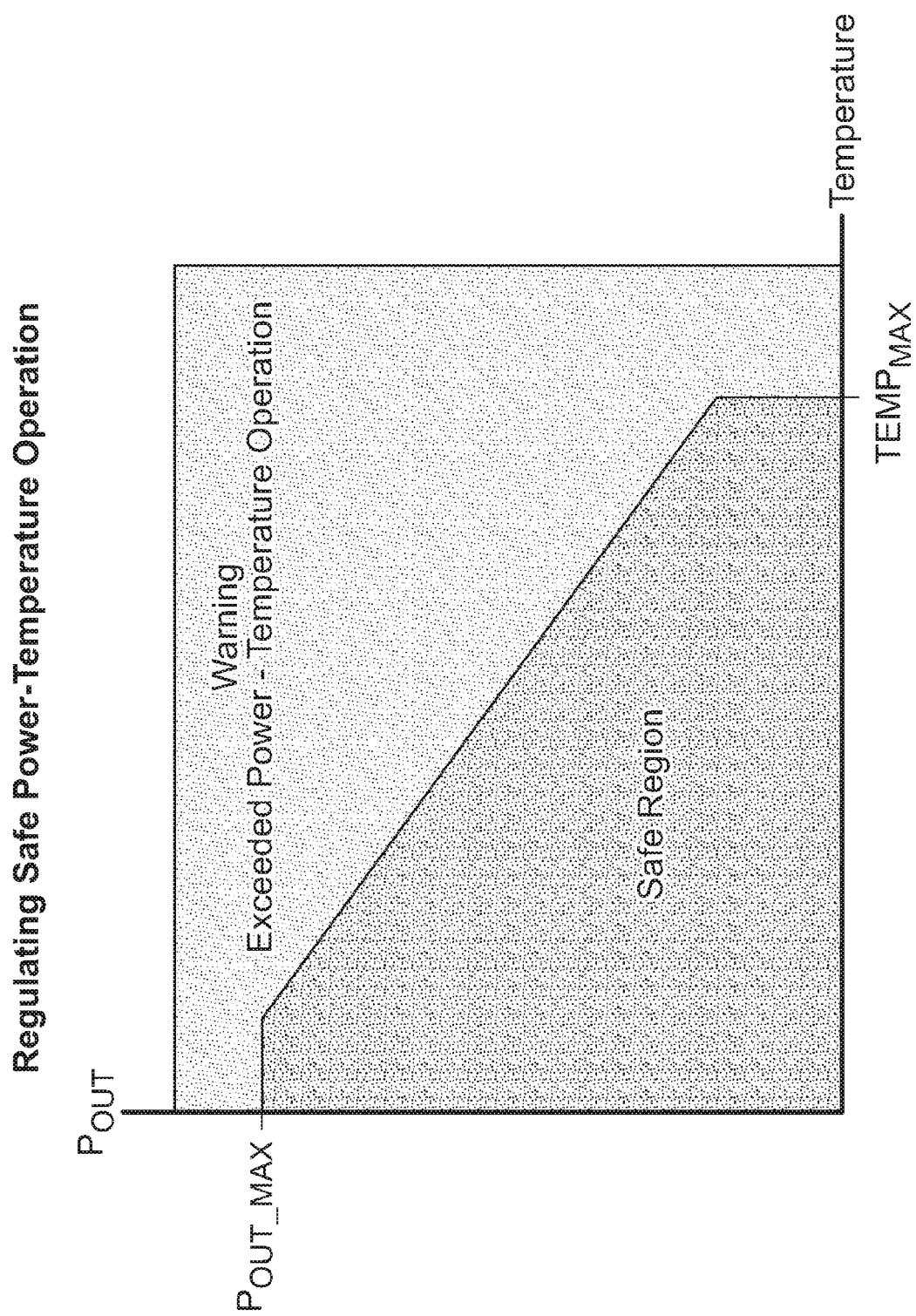
FIG. 2 is a plot illustrating an embodiment of output power versus temperature.

FIG. 2 is a plot illustrating an embodiment of output power versus temperature where the slop is negative. Equation (32) has a positive slope because temperature is represented by a complementary to absolute temperature (CTAT) voltage. While $DAC_{VALUE}$ is below or at $DAC_{LIMIT\_TEMP}$, power-temperature is maintained in a safe operating region. When $DAC_{VALUE}$ exceeds $DAC_{LIMIT\_TEMP}$, a system alert may be generated, e.g., warning that a safe power-temperature operating region has been violated, and appropriate actions may be taken. Although a power-temperature safe region has been described with respect to the above analysis, a current-temperature safe region may be similarly determined.

Figure 3:
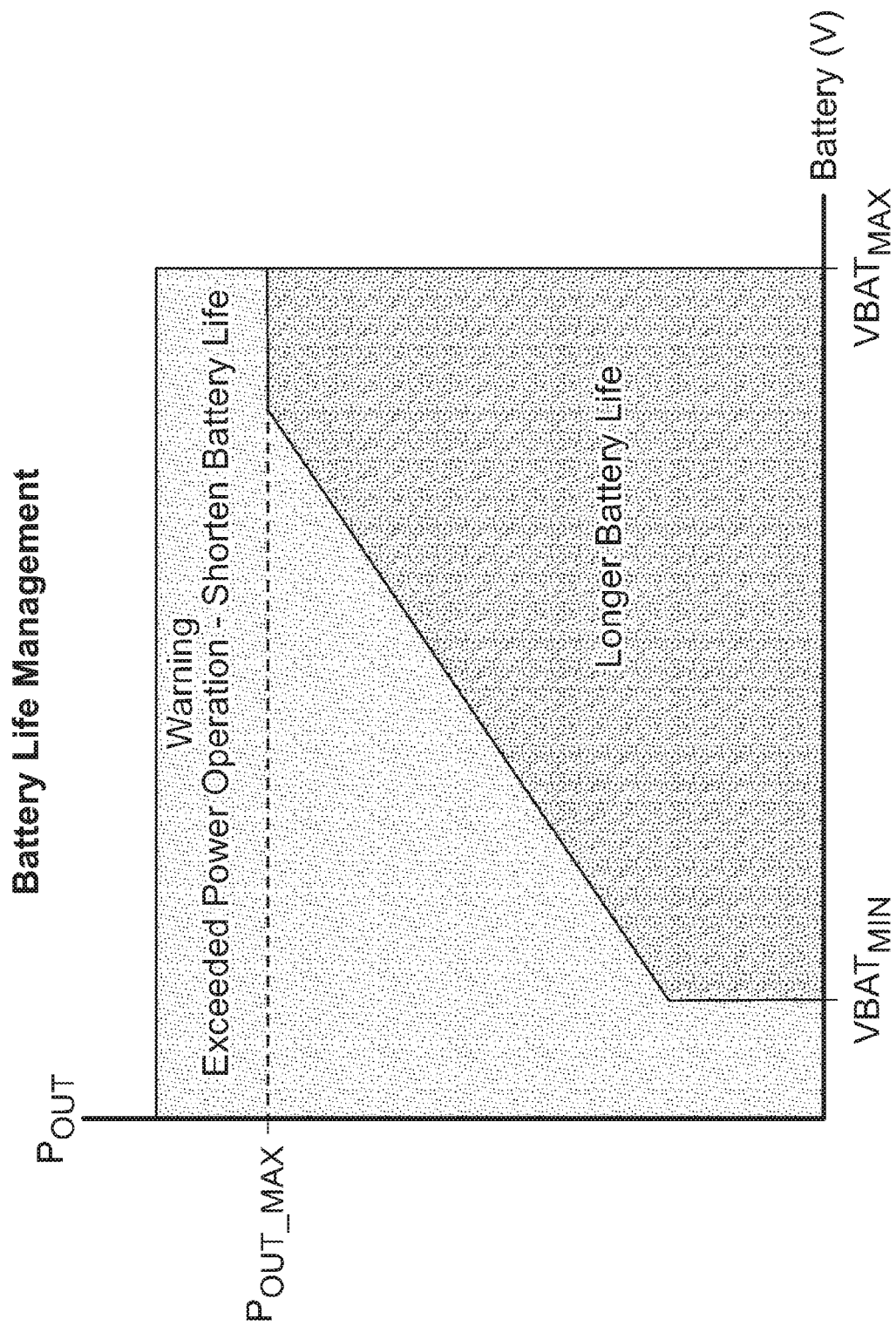
FIG. 3 is a plot illustrating an embodiment of regulating power usage based on the charge remaining on an associated battery.

In some embodiments, circuit 100 may facilitate managing power usage to extend battery life or recharge time. FIG. 3 is a plot illustrating an embodiment of regulating power usage based on the charge remaining on an associated battery. The regulated output power $P_{OUT}$ is a function of voltage $V_{BAT}$, where $V_{BAT}$ is the battery voltage level or equivalently battery charge remaining. The mathematics involved for power-battery life management are similar to those described above for power-temperature management and are described next.

In equation (16), replacing $V_{REF}$ with $V_{BAT}$ gives equation (34):

$$P_{OUT}=DAC_{VALUE}*\{V_{OUT\_MAX}*[V_{BAT}-(V_{OUT\_MAX}*R_1/R_2)]*R_{BIAS}/R_{DAC\_MAX}/R_{SENSE}\} \quad (34)$$

Taking the derivative $\partial P_{OUT}/\partial V_{BAT}$ yields equations (35) and (36):

$$DAC_{LIMIT} = \partial P_{OUT}/\partial V_{BAT} * R_{SENSE}/\{V_{OUT\_MAX} * R_{BIAS}/R_{DAC\_MAX}\} \quad (35)$$

$$DAC_{VALUE} \leq DAC_{LIMIT\_BAT} \quad (36)$$

When $DAC_{VALUE}$ exceeds $DAC_{LIMIT\_BAT}$, a system alert may be generated, e.g., warning operation in an exceeded power and shortened battery life state, so that corrective actions may be initiated. Although power-battery life management has been described with respect to the above analysis, current-battery life management may be similarly determined.

The disclosed integrated circuit solution for sensing and reporting power and directly outputting the measurement in a binary format offers numerous advantages. The ability to use an integrated solution to sense power consumption allows an associated system to manage power to optimize efficiency and prevent power overloading. The disclosed architecture facilitates the integration of one or more electrical and/or environmental parameters (e.g., current, voltage, temperature, battery voltage, etc.) during sensing and allows overall safe operating region(s) to be determined so that an associated system if able to efficiently manage the total system environment. As described, in some embodiments, the architecture only needs a single ADC (analog-to-digital converter) to integrate a plurality of parameters. Furthermore, the disclosed solution introduces few sources of errors, if any, since the measurement is a function of ratio(s) of resistors.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. An integrated circuit, comprising:
an internal resistor on which a sense voltage sensed across an external resistor in response to a load current is mirrored; and
an analog-to-digital converter whose output sets a resistor ladder that regulates the voltage across the internal resistor to mirror the sense voltage and comprises a digital value representing power.

2. The integrated circuit of claim 1, further comprising circuitry to integrate one or more electrical or environmental parameters in the digital value representing power.

3. The integrated circuit of claim 1, further comprising circuitry to integrate a system temperature value in the digital value representing power.

4. The integrated circuit of claim 1, further comprising circuitry to integrate a battery voltage value in the digital value representing power.

5. The integrated circuit of claim 1, further comprising circuitry to generate a warning in the event that a safe operating region is violated.

6. The integrated circuit of claim 5, wherein the safe operating region is associated with power and temperature.

7. The integrated circuit of claim 5, wherein the safe operating region is associated with power and remaining battery charge.

8. The integrated circuit of claim 1, wherein the digital value representing power represents power consumed by a load of an associated system.

9. The integrated circuit of claim 1, wherein the digital value representing power represents a total power margin for an associated system.

10. The integrated circuit of claim 1, wherein the digital value representing power represents a current.

11. The integrated circuit of claim 1, wherein the digital value representing power is a function of one or more ratios of resistance values.

12. A computer program product embodied in a non-transitory computer readable storage medium and comprising computer instructions for:
mirroring a sense voltage sensed across an external resistor in response to a load current on an internal resistor of an integrated circuit; and
regulating voltage across the internal resistor to mirror the sense voltage using a resistor ladder set by an output of an analog-to-digital converter comprising the integrated circuit,
wherein the output of the analog-to-digital converter comprises a digital value representing power.

13. A method, comprising:
mirroring a sense voltage sensed across an external resistor in response to a load current on an internal resistor of an integrated circuit; and
regulating voltage across the internal resistor to mirror the sense voltage using a resistor ladder set by an output of an analog-to-digital converter comprising the integrated circuit, wherein the output of the analog-to-digital converter comprises a digital value representing power.

14. The method of claim 13, further comprising integrating one or more electrical or environmental parameters in the digital value representing power.

15. The method of claim 13, further comprising integrating a system temperature value in the digital value representing power.

16. The method of claim 13, further comprising integrating a battery voltage value in the digital value representing power.

17. The method of claim 13, further comprising generating a warning in the event that a safe operating region is violated.

18. The method of claim 17, wherein the safe operating region is associated with power and temperature.

19. The method of claim 17, wherein the safe operating region is associated with power and remaining battery charge.

20. The method of claim 13, wherein the digital value representing power represents power consumed by a load of an associated system.

21. The method of claim 13, wherein the digital value representing power represents a total power margin for an associated system.

22. The method of claim 13, wherein the digital value representing power represents a current.

23. The method of claim 13, wherein the digital value representing power is a function of one or more ratios of resistance values.

* * * * *